United States Patent
Oh et al.

(10) Patent No.: US 10,784,429 B2
(45) Date of Patent: Sep. 22, 2020

(54) LIGHT EMITTING ELEMENT PACKAGE WITH THIN FILM PAD AND MANUFACTURING METHOD THEREOF

(71) Applicant: LUMENS CO., LTD., Yongin-si, Gyeonggi-do (KR)

(72) Inventors: Seung Hyun Oh, Yongin-si (KR); Hyo Gu Jeon, Yongin-si (KR); Chi Gyun Song, Yongin-si (KR); Jung Hye Park, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 16/371,756

(22) Filed: Apr. 1, 2019

(65) Prior Publication Data

US 2019/0348591 A1   Nov. 14, 2019

(30) Foreign Application Priority Data

May 10, 2018   (KR) ......................... 10-2018-0053440

(51) Int. Cl.
*H01L 33/64* (2010.01)
*H01L 25/075* (2006.01)
(Continued)

(52) U.S. Cl.
CPC ........ *H01L 33/647* (2013.01); *H01L 25/0753* (2013.01); *H01L 33/54* (2013.01);
(Continued)

(58) Field of Classification Search
None
See application file for complete search history.

(56) References Cited

U.S. PATENT DOCUMENTS 9,791,112 B2 * 10/2017 Del Castillo ........... F21K 9/278
10,158,056 B2 * 12/2018 Imai ...................... H01L 33/505
(Continued)

FOREIGN PATENT DOCUMENTS

KR   10-2005-0087192 A   8/2006

*Primary Examiner* — J. E. Schoenholtz
(74) *Attorney, Agent, or Firm* — Mei & Mark LLP

(57) ABSTRACT

The present invention relates to a light emitting element package with a thin film pad and a manufacturing method thereof, and more particularly, to a light emitting element package with a thin film pad, which mounts and molds a light emitting diode on a thin film pad formed on a substrate and then, separates the light emitting diode from the substrate and configures a light emitting element package to effectively suppress occurrence of defective soldering or the like by securing a sufficient pad area and shape required for soldering by using the thin film pad while implementing a small light emitting element package such as a chip scale package or the like and a manufacturing method thereof.
Disclosed is a light emitting element package including: a plurality of light emitting diodes having a first electrode pad and a second electrode pad at a lower portion thereof; a thin film pad having the plurality of light emitting diodes mounted thereon and constituted by one common thin film pad and a plurality of individual thin film pads; and a molding layer molding the plurality of light emitting diodes and the thin film pad, in which a lower surface of the thin film pad has a light emitting element package soldering region for soldering the light emitting element package, and an area of the light emitting element package soldering region is larger than that of each of the first electrode pad and the second electrode pad of the light emitting diode.

20 Claims, 10 Drawing Sheets

(51) Int. Cl.
*H01L 33/54* (2010.01)
*H01L 33/60* (2010.01)
*H01L 33/62* (2010.01)

(52) U.S. Cl.
CPC .............. *H01L 33/60* (2013.01); *H01L 33/62* (2013.01); *H01L 2933/005* (2013.01); *H01L 2933/0033* (2013.01); *H01L 2933/0058* (2013.01); *H01L 2933/0066* (2013.01); *H01L 2933/0075* (2013.01)

(56) References Cited

U.S. PATENT DOCUMENTS

| | | | |
|---|---|---|---|
| 10,217,903 B2* | 2/2019 | Perzlmaier | H01L 25/0753 |
| 2015/0316215 A1* | 11/2015 | Togawa | H01L 25/0753 |
| | | | 362/231 |
| 2018/0123008 A1* | 5/2018 | Imai | H01L 33/505 |
| 2019/0081221 A1* | 3/2019 | Jeon | H01L 33/54 |
| 2019/0104617 A1* | 4/2019 | Sakamoto | H05K 3/061 |
| 2019/0348591 A1* | 11/2019 | Oh | H01L 25/0753 |

* cited by examiner

LIGHT EMITTING ELEMENT PACKAGE WITH THIN FILM PAD AND MANUFACTURING METHOD THEREOF

CROSS-REFERENCE TO RELATED APPLICATIONS

This application claims priorities to Korean Patent Application No. 10-2018-0053440 filed on May 10, 2018 in Korean Intellectual Property Office, the entire contents of which is hereby incorporated by reference in its entirety.

BACKGROUND OF THE INVENTION

Field of the Invention

The present invention relates to a light emitting element package with a thin film pad and a manufacturing method thereof, and more particularly, to a light emitting element package with a thin film pad, which mounts and molds a light emitting diode on a thin film pad formed on a substrate and then, separates the light emitting diode from the substrate and configures a light emitting element package to effectively suppress occurrence of a soldering failure or the like by securing a sufficient pad area and shape required for soldering by using the thin film pad while implementing a small light emitting element package such as a chip scale package or the like and a manufacturing method thereof.

Description of the Related Art

In recent years, light emitting devices including a light emitting diode (LED) and the like have been used in various applications such as various display devices, lighting devices, and the like. In general, the light emitting diode obtains a luminescent effect by using electroluminescence (electric field emission) generated when a voltage is applied to a semiconductor.

In the related art, generally, as illustrated in FIG. 1, a light emitting element is configured by mounting the light emitting diode 30 on a substrate 22 with an electrode 21, but in such a case, there is a problem that it is difficult to decrease a size of the light emitting element to a predetermined level or more.

In this regard, as illustrated in FIG. 2A, a method is attempted, which implements a small package such as a chip scale package (CSP) or the like by implementing the light emitting element by directly molding the light emitting diode 30 on a molding layer 40 without using the substrate. However, in this case, as illustrated in FIG. 2B, an electrode pad is positioned below the light emitting diode 30, and an electrode pad area ((A) of FIG. 2B) for soldering the light emitting diode 30 is narrow and an electrode pad shape is also limited, so that a soldering failure occurs in a surface mount technology (SMT) process, etc., resulting in a problem of non-lighting and yield reduction and furthermore, there is also a problem that it is difficult even to effectively dissipate heat generated from the light emitting diode 30 in such a structure. In a micro-LED chip having a chip size of 100 um or less, the size of the electrode pad is only approximately 50 to 70 um, so that the soldering failure may more easily occur, which brings about a large difficulty in manufacturing a micro-LED.

As a result, in implementing a small light emitting element such as a chip scale package (CSP) or the like by using the light emitting diode (LED), a light emitting element package is required, which has a structure to solve a soldering failure problem according to a limitation in pad area and shape and furthermore, improve a heat dissipation characteristic problem, but an appropriate solution for the problems has not yet been provided.

BRIEF SUMMARY OF THE INVENTION

The present invention has been made in an effort to provide a light emitting element package which has a structure to solve a soldering failure problem according to a limitation in pad area and shape and furthermore, improve a heat dissipation characteristic problem in implementing a small light emitting element such as a chip scale package (CSP) or the like by using the light emitting diode (LED) and a manufacturing method thereof.

An exemplary embodiment of the present invention provides a light emitting element package including: a plurality of light emitting diodes having a first electrode pad and a second electrode pad at a lower portion thereof; a thin film pad having the plurality of light emitting diodes mounted thereon and constituted by one common thin film pad and a plurality of individual thin film pads; and a molding layer molding the plurality of light emitting diodes and the thin film pad, in which a lower surface of the thin film pad has a light emitting element package soldering region for soldering the light emitting element package, and an area of the light emitting element package soldering region is larger than that of each of the first electrode pad and the second electrode pad of the light emitting diode.

In this case, a conductive adhesive may be provided between the first electrode pad and the second electrode pad, and the thin film pad.

The thin film pad may include a light emitting diode mounting region on which the one or more light emitting diodes are mounted, and the light emitting diode mounting region may have a shape corresponding to the light emitting diode.

A maximum width of the light emitting element package soldering region may be larger than the maximum width of the light emitting diode mounting region.

One of the plurality of individual thin film pads may have a direction identification shape for discriminating a direction of the light emitting element.

The light emitting element package may further include a reflective layer configured by white molding a side of a light emitting diode mounted on the thin film pad.

The thin film pad may be formed by a nickel made plating film.

Another exemplary embodiment of the present invention provides a method for manufacturing a light emitting element package, including: forming a plurality of thin film pads on a substrate; mounting a plurality of light emitting diodes having a first electrode pad and a second electrode pad formed on each thin film pad on the substrate; configuring one or more light emitting element packages on the substrate by forming a molding layer molding the thin film pad and the light emitting diode; and separating the one or more light emitting element packages from the substrate, in which a lower surface of the thin film pad has a light emitting element package soldering region for soldering the light emitting element package, and an area of the light emitting element package soldering region is larger than that of each of the first electrode pad and the second electrode pad of the light emitting diode.

In this case, in the forming of the thin film pad, when predetermined magnitude of force is applied to the light emitting element, the substrate and the thin film pad may be made of a material and formed in a structure to separate the light emitting element from the substrate without changing a shape in thin film pad.

As the substrate, a stainless (SUS) made substrate may be used, and the thin film pad may be formed by forming a nickel made plating film on the substrate.

A conductive adhesive may be provided between the first electrode pad and the second electrode pad, and the thin film pad.

The thin film pad may include a light emitting diode mounting region on which the one or more light emitting diodes are mounted, and the light emitting diode mounting region may have a shape corresponding to the light emitting diode.

In this case, a maximum width of the light emitting element package soldering region may be larger than the maximum width of the light emitting diode mounting region.

As the light emitting diode, three types of light emitting diodes of red (R), green (G), and blue (B) series may be used, and the thin film pad may include a plurality of mounting regions for mounting the three types of light emitting diodes.

One of the plurality of individual thin film pads may have a direction identification shape for discriminating a direction of the light emitting element.

The configuring of the light emitting element package may include forming a reflective layer by white molding sides of one or more light emitting diodes mounted on the thin film pad.

According to an exemplary embodiment of the present invention, in a light emitting element package with a thin film pad and a manufacturing method thereof, one or more light emitting diodes are mounted on a thin film pad formed on a substrate and the thin film pad and the one or more light emitting diodes are molded and then, separated from the substrate to configure a light emitting element package, thereby solving a soldering failure problem which may appear according to a limitation in pad area and shape of a light emitting element and furthermore, effectively improving even a heat dissipation characteristic problem.

BRIEF DESCRIPTION OF THE DRAWINGS

In order to help understanding of the present invention, the accompanying drawings which are included as a part of the Detailed Description provide embodiments of the present invention and describe the technical spirit of the present invention together with the Detailed Description.

DETAILED DESCRIPTION OF THE INVENTION

The present invention may have various modifications and various embodiments and hereinafter, specific embodiments will be described in detail based on the accompanying drawings.

In describing the present invention, a detailed description of related known technologies will be omitted if it is determined that they make the gist of the present invention unclear.

Terms including as first, second, and the like are used for describing various constituent elements, but the constituent elements are not limited by the terms and the terms are used only for distinguishing one constituent element from other constituent elements.

Hereinafter, exemplary embodiments of a light emitting element with a thin film pad and a manufacturing method thereof according to an exemplary embodiment of the present invention will be described in detail with reference to the accompanying drawings.

Figure 1:
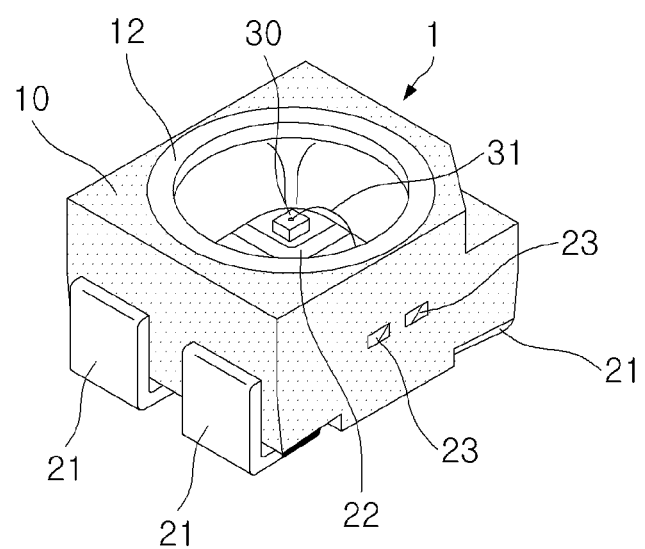
FIG. 1 illustrates a shape of a normal light emitting element.
Figure 2A:
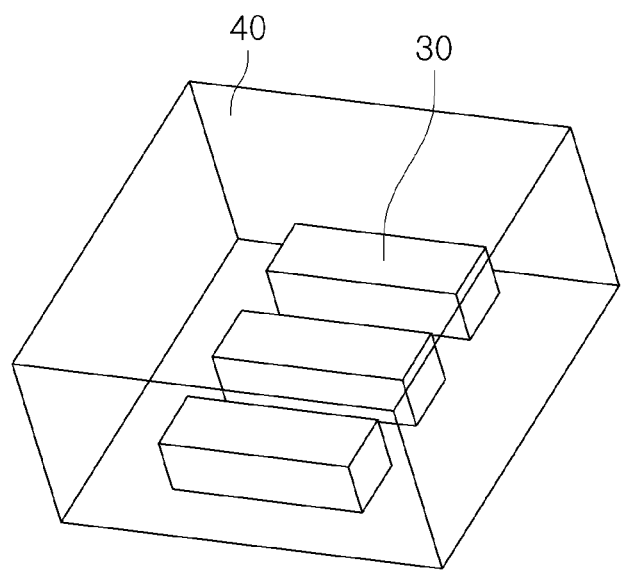
FIGS. 2A and 2B are exemplary diagrams of a light emitting element package configured by molding a light emitting diode in the related art.
Figure 2B:
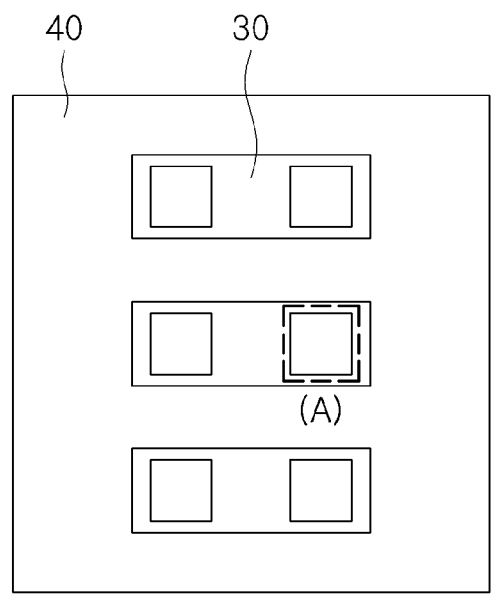

First, as illustrated in FIGS. 2A and 2B above, when the light emitting diode 30 is directly molded into the molding layer 40 without using the substrate in the related art to implement a small package such as a chip scale, the area of a pad positioned at a lower portion of the light emitting diode 30 is narrow and formation of the pad is limited. Therefore, a soldering failure may occur and non-lighting and yield reduction problems may occur in a surface mount technology (SMT) process or the like and furthermore, there may be a problem that it is difficult to effectively dissipate heat generated from the light emitting diode 30 in such a structure.

Figure 3A:
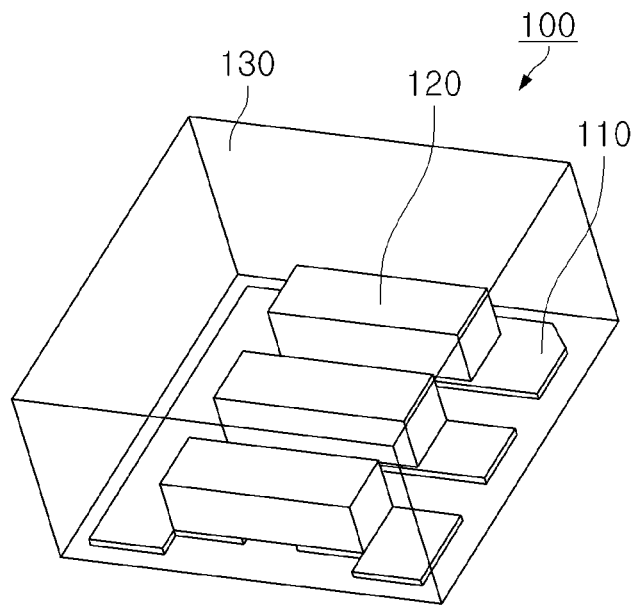
FIGS. 3A and 3B are exemplary diagrams of a light emitting element package according to an exemplary embodiment of the present invention.
Figure 3B:
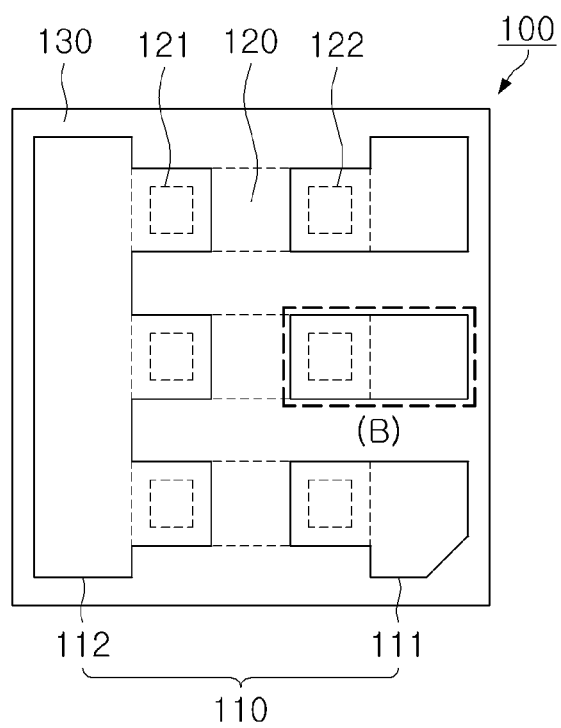

In this regard, FIGS. 3A and 3B illustrate a perspective view of a light emitting element package 100 with a thin film pad 110 according to an exemplary embodiment of the present invention. As illustrated in FIGS. 3A and 3B, the light emitting element package 100 with the thin film pad 110 according to an exemplary embodiment of the present invention may be configured to include a plurality of light emitting diodes 120 having a first electrode pad 121 and a second electrode pad 122 formed at a lower portion, a thin film pad 110 on which the plurality of light emitting diodes 120 is mounted and which is constituted by one common thin film pad 112 and a plurality of individual thin film pads 111, and a molding layer 130 molding the plurality of light emitting diodes 120 and the thin film pad 110 and in this case, a lower surface of the thin film pad 110 has a light emitting element package soldering region ((B) of FIG. 3B) for soldering the light emitting element package 100 and an area of the light emitting element package soldering region is larger than that of each of the first electrode pad 121 and the second electrode pad 122 of the light emitting diode 120.

Accordingly, in the light emitting element package 100 with the thin film pad 110 according to an exemplary embodiment of the present invention, as illustrated in FIGS. 3A and 3B, a pad area ((B) of FIG. 3B (bottom view)) sufficient for soldering may be secured by using the thin film pad 110 which is separately provided and the pad shape may also be easily changed to a more appropriate shape by considering a soldering condition, etc, thereby effectively solving the problem such as the soldering failure or the like due to the limited pad area ((A) of FIG. 2B) and shape in the related art.

In the light emitting element package 100 with the thin film pad 110 according to an exemplary embodiment of the present invention, as illustrated in FIGS. 3A and 3B, the first electrode pads 121 of the plurality of light emitting diodes may be commonly mounted to the one common thin film pad 112 and the second electrode pads 122 of the plurality of light emitting diodes may be individually mounted on the plurality of individual thin film pads 111, respectively.

In the light emitting element package 100 with the thin film pad 110 according to an exemplary embodiment of the present invention, a conductive adhesive such as a solder or the like is provided between the first electrode pad 121 and the second electrode pad 122, and the thin film pad 110 to seat and stably fix the first electrode pad 121 and the second electrode pad 122 of the light emitting diode 120 to the thin film pad 110.

Figure 4:
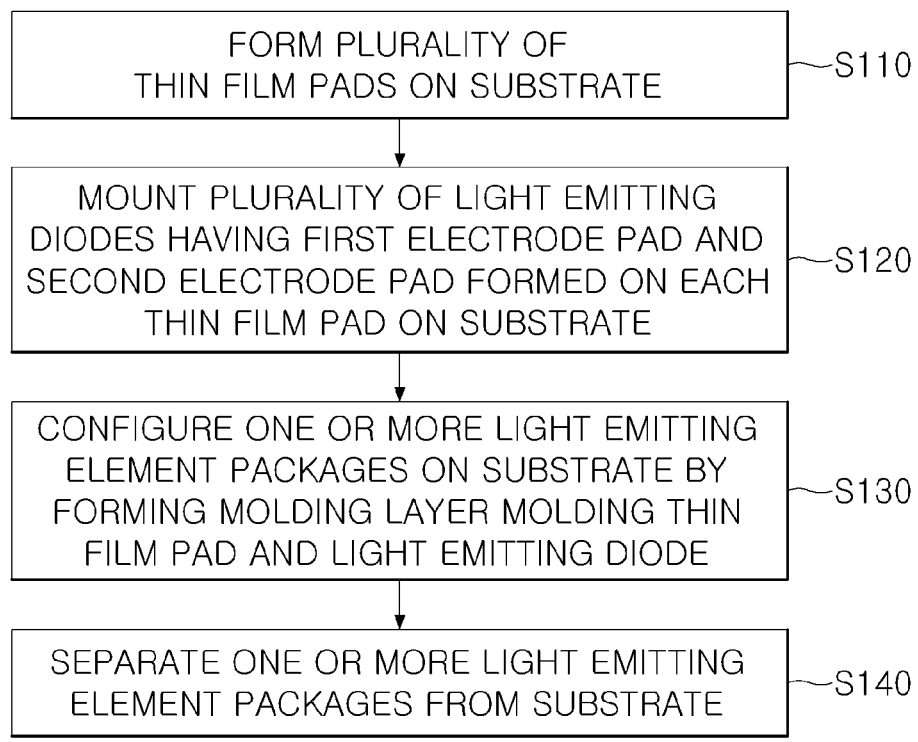
FIG. 4 is a flowchart of a manufacturing method of a light emitting element package according to an exemplary embodiment of the present invention.

FIG. 4 illustrates a flowchart of a manufacturing method of a light emitting element package 100 with a thin film pad 110 according to an exemplary embodiment of the present invention. As illustrated in FIG. 4, the manufacturing method of the light emitting element package 100 with the thin film pad 110 according to an exemplary embodiment of the present invention may include a thin film pad forming step (S110) of forming a plurality of thin film pads 110 on a substrate 200, a step (S120) of mounting a plurality of light emitting diodes 120 having a first electrode pad 121 and a second electrode pad 122 formed on each thin film pad 110 on the substrate 200, a light emitting element package configuring step (S130) of configuring one or more light emitting element packages 100 on the substrate 200 by forming a molding layer 130 molding the thin film pad 110 and the light emitting diode 120, and a light emitting element package separating step (S140) of separating the one or more light emitting element packages 100 from the substrate 200.

Hereinafter, the light emitting element package 100 with the thin film pad 110 and the manufacturing method thereof according to an exemplary embodiment of the present invention will be described in more detail with reference to FIGS. 3A, 3B, 4A and 4B.

Figure 5A:
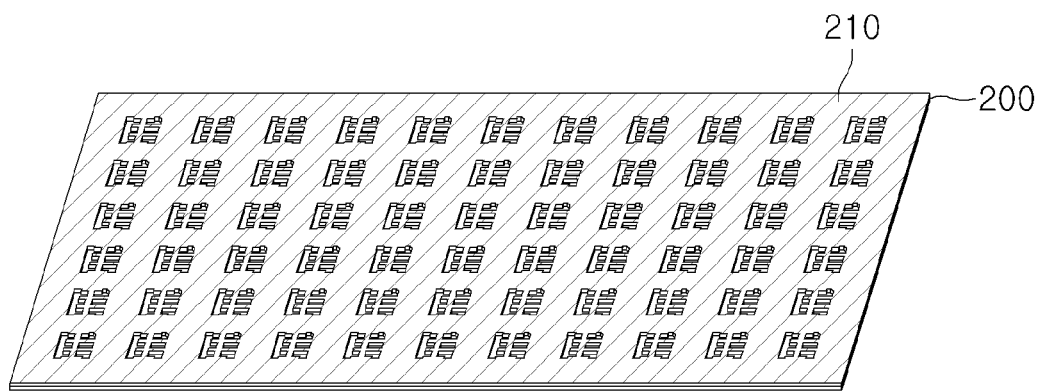
FIGS. 5A to 5F are diagrams for describing a manufacturing method of a light emitting element package according to an exemplary embodiment of the present invention.
Figure 5B:
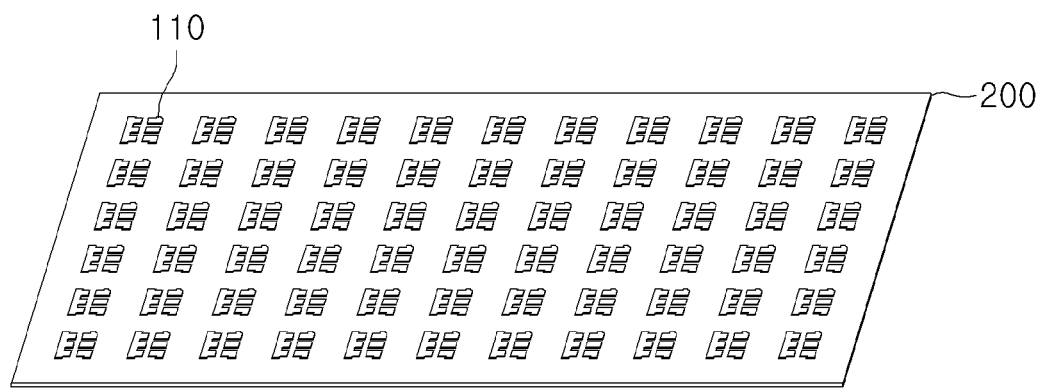

First, the thin film pad forming step (S110) in the manufacturing method of the light emitting element package 100 with the thin film pad 110 according to an exemplary embodiment of the present invention is described. More specifically, in the thin film pad forming step (S110), as illustrated in FIG. 5A, the thin film pad 110 is formed on the substrate 200 by using a plating process while placing a mask 210 on the substrate 200 and then, the mask 210 is removed, thereby forming a plurality of thin film pads 110 on the substrate 200 as illustrated in FIG. 5B.

In this case, when a predetermined magnitude of force is applied to the light emitting element 100 formed on the substrate 200, the substrate 200 and the thin film pad 110 are preferably made of a material and formed in a structure to easily separate the light emitting element 100 from the substrate 200 without changing a shape of the thin film pad 110. That is, the thin film pad 110 may be made of a material and formed in a structure to be stably fixed to the substrate 200 during the process of forming the light emitting element 100, whereas to be easily separated from the substrate 200 without a damage such as a change in shape of the thin film pad 100, etc., when predetermined force calculated through an experiment is applied after the light emitting element 100 is formed.

As a more specific example, the present inventors use a substrate made of a stainless (SUS) material as the substrate 200 and confirm that when the thin film pad 110 is formed by forming a plating film made of a nickel (Ni) material on the substrate 200 through the plating process, the thin film pad 110 is stably fixed to the substrate 200 in the process of forming the light emitting element 100, whereas after the light emitting element 100 is formed, when predetermined magnitude of force is applied, the thin film pad 110 may be easily separated from the substrate 200 without changing the shape of the thin film pad 110.

However, in the present invention, it is not necessary to use the stainless (SUS) made substrate and the nickel made plating film as the substrate 200 and the thin film pad 110 and besides, if the thin film pad 110 is made of the material and formed in the structure to be stably fixed to the substrate 200 in the process of forming the light emitting element 100, whereas to be easily separated from the substrate 200 without the damage such as the change in shape of the thin film pad 110, etc., when the predetermined force is applied after the light emitting element 100 is formed, the thin film pad 110 may be applied to the present invention without any particular limitation.

Figure 5C:
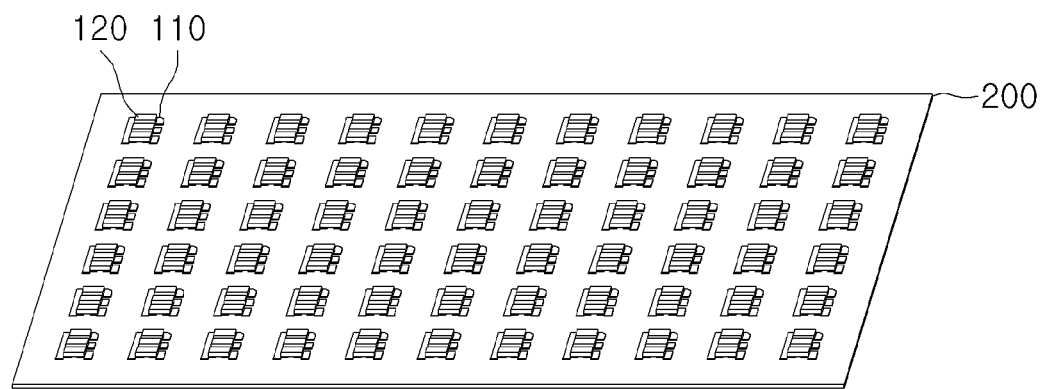

Next, in step S120, as illustrated in FIG. 5C, a plurality of light emitting diodes 120 with the first electrode pad 121 and the second electrode pad 122 is mounted on each thin film pad 110 on the substrate 200.

In this case, as illustrated in FIGS. 3A and 3B, the thin film pad 110 is constituted by one common thin film pad 112 and a plurality of individual thin film pads 111, the first electrode pads 121 of the plurality of light emitting diodes 120 are commonly mounted on the one common thin film pad 112, and the second electrode pads 122 of the plurality of light emitting diodes 120 are individually mounted on the plurality of individual thin film pads 111, respectively.

The surface mount technology (SMT) process, etc., may be used in mounting the plurality of light emitting diodes 120 on each thin film pad 100 on the substrate 200. In this case, three types of light emitting diodes of red (R), green (G), and blue (B) may be used as the plurality of light emitting diodes 120, and as a result, the thin film pad 110 includes a plurality of mounting regions for mounting the three types of light emitting diodes to seat the plurality of light emitting diodes 120 on the mounting region.

Prior to mounting the plurality of light emitting diodes 120 on the thin film pad 110, step S120 may include forming the conductive adhesive such as the solder between the first electrode pad 121 and the second electrode pad 122, and the thin film pad 110, and as a result, the first electrode pad 121 and the second electrode pad 122 of the light emitting diode 120 are seated on the thin film pad 110 to be stably fixed.

Next, in the light emitting element package configuring step (S130), the molding layer 130 molding the thin film pad 110 and the light emitting diode 120 is formed to configure one or more light emitting element packages 100 on the substrate 200.

Figure 5D:
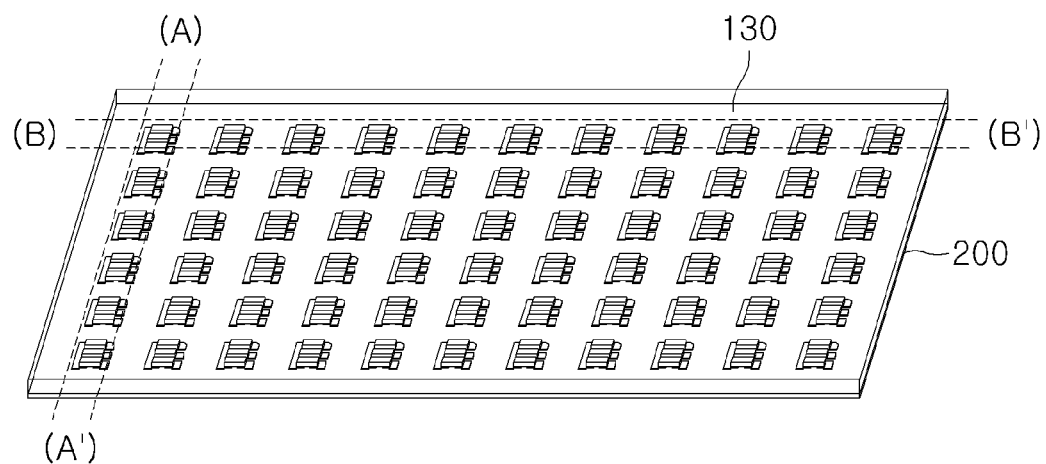

More specifically, the plurality of light emitting diodes 120 may be mounted on the substrate 200 through the surface mount technology (SMT) process, etc. and then, the molding layer 130 molding the plurality of thin film pads 110 and the plurality of light emitting diodes 120 on the substrate 200 by using a molding material such as a silicon, etc., may be formed as illustrated in FIG. 5D and next, a plurality of light emitting element packages 100 is configured by cutting (singulating) the molding layer 130 along a predetermined path (e.g., (A)-(A'), or (B)-(B') in FIG. 5D).

The light emitting element package configuring step (S130) may further include forming the reflective layer 140 by white-molding sides of one or more light emitting diodes 120 mounted on the thin film pad 110.

Figure 6A:
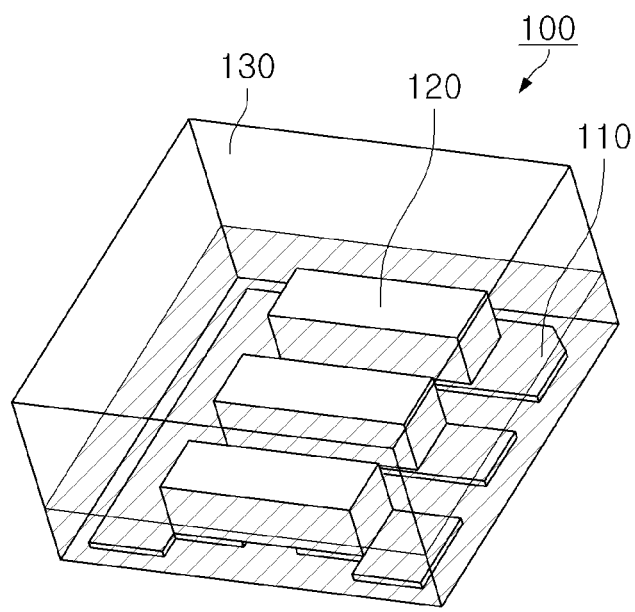
FIGS. 6A and 6B are exemplary diagrams of a light emitting element package with a reflective layer according to an exemplary embodiment of the present invention.
Figure 6B:
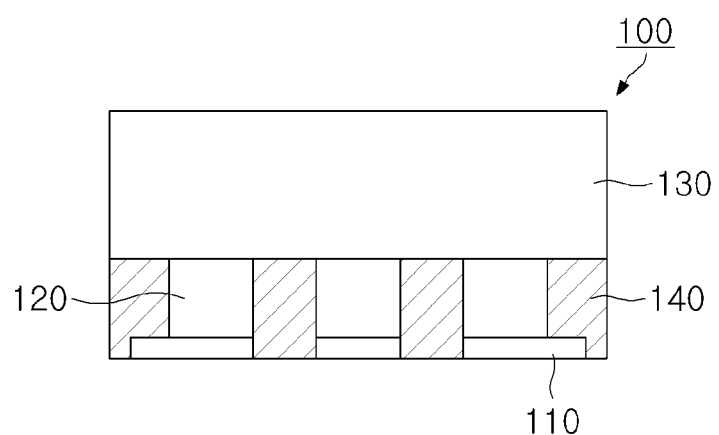

As a result, as illustrated in FIGS. 6A and 6B, the light emitting element package 100 includes the reflective layer 140 by white-molding the sides of the one or more light emitting diodes 120 to reflect light emitted toward the side of the light emitting diode 120, thereby increasing a light amount emitted upward.

Figure 5E:
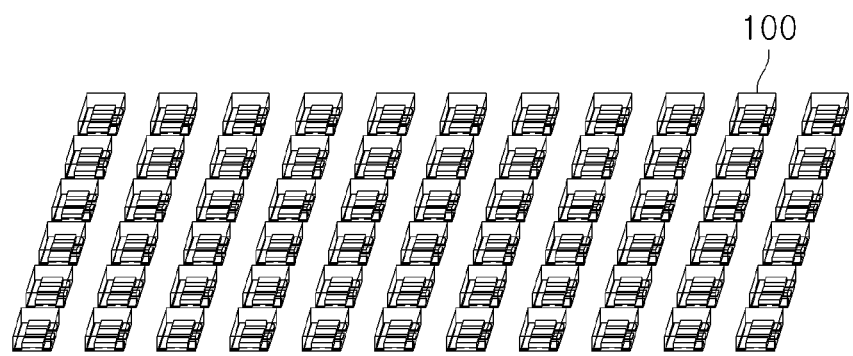
Figure 5F:
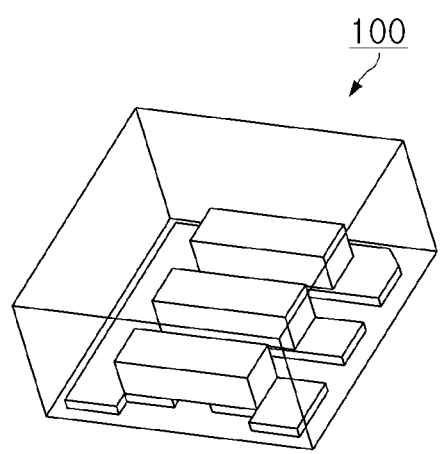

Next, in the light emitting element separating step (S140), as illustrated in FIG. 5E, the one or more light emitting element packages 100 are separated from the substrate 200.

In this case, when a predetermined magnitude of force is applied to the light emitting element package 100, the substrate 200 and the thin film pad 110 are preferably made of a material and formed in a structure to easily separate the light emitting element package 100 from the substrate 200 without changing the shape of the thin film pad 110.

Accordingly, in the light emitting element separating step (S140), the light emitting element package 100 may be easily separated from the substrate 200 by applying predetermined optimum force through the experiment or the like.

In the present invention, in order to separate the light emitting element package 100 from the substrate 200, it is not particularly required to apply the predetermined magnitude of force to the light emitting element package 100 and besides, a process capable of easily separating the light emitting element package 100 from the substrate 200, such as a chemical process or the like may be applied to the present invention without any particular limitation.

In the light emitting element 100 with the thin film pad 110 according to an exemplary embodiment of the present invention, an upper surface of the thin film pad 110 is connected to the electrode pads 121 and 122 (FIG. 3B) of the light emitting diode 120 and a lower surface of the thin film pad 110 configures the light emitting element soldering region ((B) of FIG. 3B) for soldering the light emitting element 110 and in this case, the area of the light emitting element soldering region is preferably larger than that of the electrode pad of the light emitting diode 110.

Accordingly, in the light emitting element package 100 according to an exemplary embodiment of the present invention, a separate thin film pad 110 is provided to configure the light emitting element soldering region for soldering the light emitting element package 100, and as a result, a sufficient pad area and a sufficient pad shape required for soldering are secured to effectively suppress the occurrence of the soldering failure or the like.

In the light emitting element package 100 with the thin film pad 110 according to an exemplary embodiment of the present invention, three types of light emitting diodes 120 of red (R), green (G), and blue (B) series are used as the light emitting diodes 120 mounted on the thin film pad 110 to configure a light emitting element for color display. In this case, the thin film pad 110 in the light emitting element 100 may have a plurality of mounting regions for mounting the three types of light emitting diodes 120.

Figure 7A:
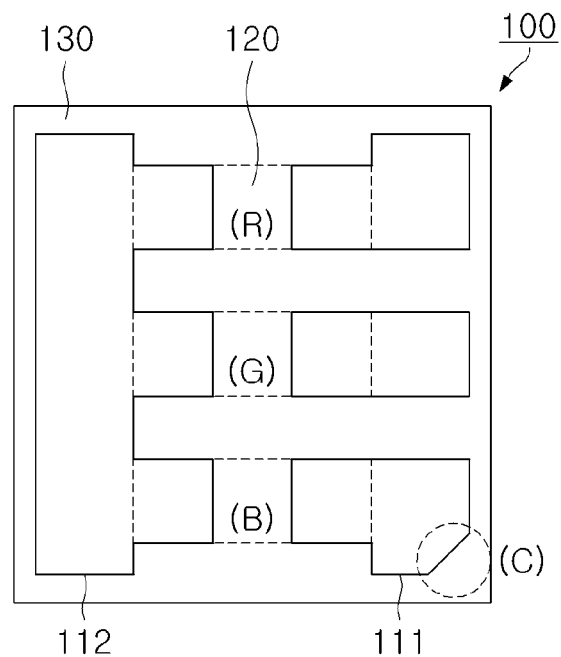
FIGS. 7A, 7B and 8 are diagrams for describing various shapes of thin film pads as an exemplary embodiment of the present invention.

For example, as illustrated in FIG. 7A, the thin film pad 110 may be provided with the plurality of mounting regions ((R), (G), and (B) of FIG. 7A) for mounting three types of light emitting diodes 120 of red (R), green (G), and blue (B) series.

In particular, as an exemplary embodiment of the present invention, the light emitting element package 100 configuring the micro-LED may be configured by using three types of light emitting diodes 120 of red (R), green (G), and blue (B) series having a chip size of 100 um or less as the light emitting diode 120.

The light emitting diode mounting region (for example, (R), (G), and (B) in FIG. 7A) in which the light emitting diode 120 is mounted may have a shape corresponding to the light emitting diode 120. That is, when the light emitting diode mounting region is considerably longer than the light emitting diode 120 or has a width significantly larger than the light emitting diode 120, a mounting orientation of the light emitting diode 120 may be changed in the surface mounting (SMT) process for the light emitting diode 120, etc. Therefore, the light emitting diode mounting region has a shape corresponding to the light emitting diode 120, and as a result, the light emitting diode 120 may maintain an accurate mounting direction.

As illustrated in FIG. 7A, the thin film pad 110 may be configured to include a common thin film pad 112 to which all of the three types of light emitting diodes 120 are soldered and a plurality of individual thin film pads 111 to which the three types of light emitting diodes 120 are soldered, respectively. In this case, it is possible to individually control the three types of light emitting diodes 120 of red (R), green (G), and blue (B) series through the individual thin film pads 111 and the common thin film pad 112 to implement a full color and more specifically, by a method for controlling power to be input through the individual thin film pads 111 and an output to be commonly made through the common thin film pad 112 when the light emitting element package 100 is attached to a printed circuit board (PCB) for the micro-LED, the three types of light emitting diodes 120 of red (R), green (G), and blue (B) series may be individually controlled.

One of the plurality of individual thin film pads 111 is provided with a direction identification shape ((C) of FIG. 7A) for discriminating the direction of the light emitting element 110 to allow an operator to easily identify the direction of the light emitting element 100.

In the light emitting element package 100 with the thin film pad 110 according to an exemplary embodiment of the present invention, a maximum width ($W_2$ in FIG. 7B) of the light emitting element soldering region (for example, (R), (G), and (B) of FIG. 7A) provided in the thin film pad 110 and used for soldering the light emitting element 100 may be larger than a maximum width ($W_1$ of FIG. 7B) of the light emitting diode mounting region, and as a result, the area of the light emitting element soldering region may be increased and the shape of the light emitting element soldering region may also be easily changed to a more appropriate shape.

Figure 7B:
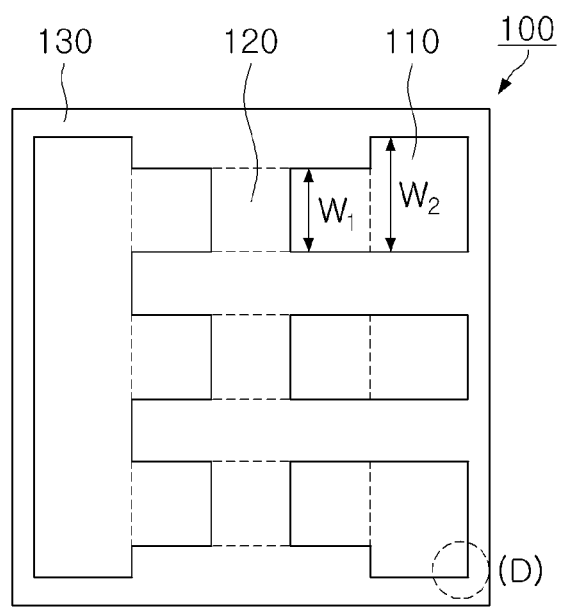

However, in the light emitting element package 100 with the thin film pad 110 according to an exemplary embodiment of the present invention, the thin film pad 110 need not particularly have the same shape as described above and may be modified to various shapes and applied according to an applied purpose. For example, as illustrated in FIG. 7B((D) of FIG. 7B), it is possible to omit the direction identification shape for discriminating the direction of the light emitting element 110.

Figure 8:
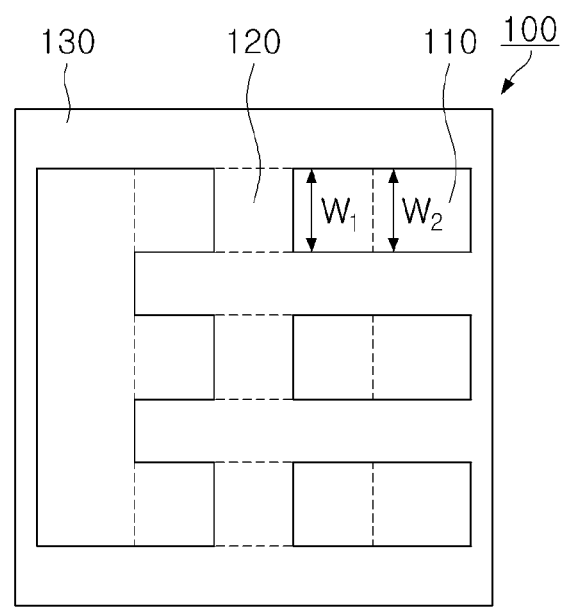

As illustrated in FIG. 8, the light emitting element package 100 with the thin film pad 110 according to an exemplary embodiment of the present invention may be configured such that the maximum width ($W_2$ of FIG. 8) of the light emitting element soldering region used for soldering the light emitting element 100 is maintained to be equal to the maximum width ($W_1$ of FIG. 8) of the light emitting diode mounting region.

In the light emitting element package 100 with the thin film pad 110 according to an exemplary embodiment of the present invention, a thickness of the thin film pad 110 is adjusted to adjust heat dissipation characteristics of the light emitting element 100.

Figure 9:
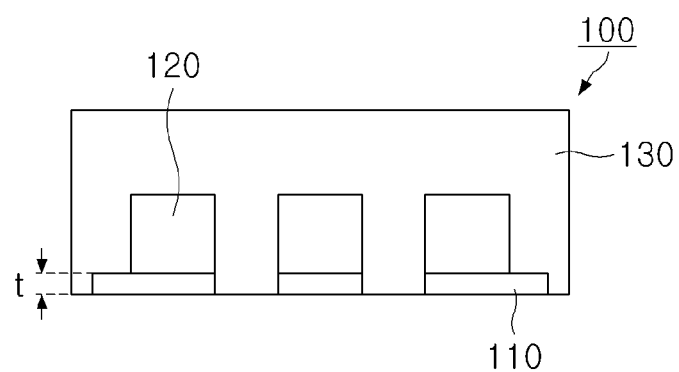
FIG. 9 is a diagram for describing adjustment of a characteristic depending on a thickness of a thin film pad as an exemplary embodiment of the present invention.

In this case, when the thin film pad 110 is formed by the plating process, the thickness of the thin film pad 110 may be adjusted by adjusting plating conditions such as a plating solution and a plating time. Furthermore, when the thickness (t in FIG. 9) of the thin film pad 110 is reduced, a heat radiation path is shortened and the heat generated in the light emitting diode 120 may be effectively discharged to the outside and a time required for the plating may be shortened, thereby improving production efficiency.

In the light emitting element 100 with the thin film pad 110 according to an exemplary embodiment of the present invention, the thickness of the thin film pad 110 may be formed by a metal thin film of approximately several microns to several tens of microns and more specifically, when the thickness t is approximately 3 microns to 10 microns, the heat radiation characteristics and the production efficiency may be effectively improved. Furthermore, depending on the purpose to which the present invention is applied, the thickness t of the thin film pad 110 is increased to suppress the lower heat dissipation.

In the light emitting element package 100 with the thin film pad 110 according to an exemplary embodiment of the present invention, in configuring the thin film pad 110, a metal plating film such as nickel or the like is formed through primary plating or the like and then, a secondary plating film is formed on the metal plating film by gold (Au) or silver (Ag) to further improve electrical conductivity or heat dissipation characteristics.

The above description just illustrates the technical spirit of the present invention and various changes and modifications can be made by those skilled in the art to which the present invention pertains without departing from an essential characteristic of the present invention. Accordingly, the exemplary embodiments disclosed in the present invention are not intended to limit the technical spirit of the present invention but describe the technical spirit of the present invention and the present invention is not limited to the exemplary embodiments. The protection scope of the present invention should be construed based on the following appended claims and it should be appreciated that the technical spirit included within the scope equivalent to the claims belongs to the scope of the present invention.

What is claimed is:

1. A light emitting element package comprising:
a plurality of light emitting diodes having a first electrode pad and a second electrode pad at a lower portion thereof;
a thin film pad having the plurality of light emitting diodes mounted thereon and constituted by one common thin film pad and a plurality of individual thin film pads; and
a molding layer molding the plurality of light emitting diodes and the thin film pad,
wherein a lower surface of the thin film pad has a light emitting element package soldering region for soldering the light emitting element package, and
an area of the light emitting element package soldering region is larger than that of each of the first electrode pad and the second electrode pad of the light emitting diode.

2. The light emitting element package of claim 1, wherein a conductive adhesive is provided between the first electrode pad and the second electrode pad, and the thin film pad.

3. The light emitting element package of claim 1, wherein the thin film pad includes a light emitting diode mounting region on which the one or more light emitting diodes are mounted, and
the light emitting diode mounting region has a shape corresponding to the light emitting diode.

4. The light emitting element package of claim 3, wherein a maximum width of the light emitting element package soldering region is larger than the maximum width of the light emitting diode mounting region.

5. The light emitting element package of claim 1, wherein one of the plurality of individual thin film pads has a direction identification shape for discriminating a direction of the light emitting element.

6. The light emitting element package of claim 1, further comprising:
a reflective layer configured by white molding a side of a light emitting diode mounted on the thin film pad.

7. The light emitting element package of claim 1, wherein the thin film pad is formed by a nickel made plating film.

8. A method for manufacturing a light emitting element package, the method comprising:
forming a plurality of thin film pads on a substrate;
mounting a plurality of light emitting diodes having a first electrode pad and a second electrode pad formed on each thin film pad on the substrate;
configuring one or more light emitting element packages on the substrate by forming a molding layer molding the thin film pad and the light emitting diode; and
separating the one or more light emitting element packages from the substrate,
wherein a lower surface of the thin film pad has a light emitting element package soldering region for soldering the light emitting element package,
wherein an area of the light emitting element package soldering region is larger than that of each of the first electrode pad and the second electrode pad of the light emitting diode, and
wherein one of the plurality of individual thin film pads has a direction identification shape for discriminating a direction of the light emitting element.

9. The method of claim 8, wherein in the forming of the thin film pad, when predetermined magnitude of force is applied to the light emitting element, the substrate and the thin film pad are made of a material and formed in a structure to separate the light emitting element from the substrate without changing a shape in the thin film pad.

10. The method of claim 9, wherein as the substrate, a stainless (SUS) made substrate is used, and
the thin film pad is formed by forming a nickel made plating film on the substrate.

11. The method of claim 8, wherein a conductive adhesive is provided between the first electrode pad and the second electrode pad, and the thin film pad.

12. The method of claim 8, wherein the thin film pad includes a light emitting diode mounting region on which the one or more light emitting diodes are mounted, and
the light emitting diode mounting region has a shape corresponding to the light emitting diode.

13. The method of claim 12, wherein a maximum width of the light emitting element package soldering region is larger than the maximum width of the light emitting diode mounting region.

14. The method of claim 8, wherein as the light emitting diode, three types of light emitting diodes of red (R), green (G), and blue (B) series are used, and the thin film pad includes a plurality of mounting regions for mounting the three types of light emitting diodes.

15. A method for manufacturing a light emitting element package, the method comprising:

forming a plurality of thin film pads on a substrate;

mounting a plurality of light emitting diodes having a first electrode pad and a second electrode pad formed on each thin film pad on the substrate;

configuring one or more light emitting element packages on the substrate by forming a molding layer molding the thin film pad and the light emitting diode; and separating the one or more light emitting element packages from the substrate, wherein a lower surface of the thin film pad has a light emitting element package soldering region for soldering the light emitting element package, wherein an area of the light emitting element package soldering region is larger than that of each of the first electrode pad and the second electrode pad of the light emitting diode, and wherein the configuring of the light emitting element package includes forming a reflective layer by white molding sides of one or more light emitting diodes mounted on the thin film pad.

16. The method of claim 15, wherein as the substrate, a stainless (SUS) made substrate is used, and the thin film pad is formed by forming a nickel made plating film on the substrate.

17. The method of claim 15, wherein a conductive adhesive is provided between the first electrode pad and the second electrode pad, and the thin film pad.

18. The method of claim 15, wherein the thin film pad includes a light emitting diode mounting region on which the one or more light emitting diodes are mounted, and the light emitting diode mounting region has a shape corresponding to the light emitting diode.

19. The method of claim 18, wherein a maximum width of the light emitting element package soldering region is larger than the maximum width of the light emitting diode mounting region.

20. The method of claim 15, wherein as the light emitting diode, three types of light emitting diodes of red (R), green (G), and blue (B) series are used, and the thin film pad includes a plurality of mounting regions for mounting the three types of light emitting diodes.

* * * * *